United States Patent [19]

Schmidt

[11] Patent Number: 4,577,393
[45] Date of Patent: Mar. 25, 1986

[54] PROCESS FOR THE PRODUCTION OF A SOLAR CELL

[75] Inventor: Wilfried Schmidt, Talheim, Fed. Rep. of Germany

[73] Assignee: Telefunken electronic GmbH, Heilbronn, Fed. Rep. of Germany

[21] Appl. No.: 669,526

[22] Filed: Nov. 8, 1984

[30] Foreign Application Priority Data

Nov. 11, 1983 [DE] Fed. Rep. of Germany ....... 3340874

[51] Int. Cl.[4] ............................................. H01L 31/18
[52] U.S. Cl. ..................................... 29/572; 136/255; 136/256; 148/188; 427/74; 427/162
[58] Field of Search ................. 29/572; 148/188; 136/255, 256, 261; 427/74, 162

[56] References Cited

U.S. PATENT DOCUMENTS

| | | | |
|---|---|---|---|
| 3,361,594 | 1/1968 | Iles et al. | 136/256 |
| 3,755,015 | 8/1973 | Redington et al. | 148/188 |
| 4,101,351 | 7/1978 | Shah et al. | 148/188 |
| 4,251,285 | 2/1981 | Yoldas et al. | 136/256 |
| 4,276,137 | 6/1981 | Hovel et al. | 204/164 |
| 4,278,831 | 7/1981 | Riemer et al. | 136/256 |
| 4,331,703 | 5/1982 | Lindmayer | 427/37 |
| 4,377,901 | 3/1983 | David et al. | 29/572 |
| 4,468,853 | 9/1984 | Morita et al. | 29/572 |

FOREIGN PATENT DOCUMENTS

| | | | |
|---|---|---|---|
| 022956 | 1/1981 | European Pat. Off. | 136/256 |
| 024057 | 2/1981 | European Pat. Off. | 136/261 |
| 054737 | 6/1982 | European Pat. Off. | 136/256 |
| 1202912 | 10/1965 | Fed. Rep. of Germany . | |
| 58-18974 | 2/1983 | Japan | 136/256 |
| 58-18976 | 2/1983 | Japan | 136/256 |
| 58-18977 | 2/1983 | Japan | 136/256 |

OTHER PUBLICATIONS

Conf. Record, 12th IEEE Photovoltaic Specialists Conf. (1976), pp. 360-361.
Conf. Record, 15th IEEE Photovoltaic Specialists Conf. (1981), pp. 450-454.
Chandler et al, "The Properties of Silica Diffusion Sources . . . , " J. Electrochem. Soc.: Electrochemical Science and Technology, vol. 124, No. 9 (1977), pp. 1409-1413.
Yoldas, "Diffusion of Dopants from Optical Coatings . . . ", J. Electrochem. Soc.: Solid-State Science and Technology, vol. 127, No. 11, (1980), pp. 2478-2481.
Jain et al, "Fabrication of P+-N-N+ Silicon Solar Cells . . . ," J. Appl. Phys., vol. 52, No. 7 (1981), pp. 4821-4824.
Alamo et al, "Operating Limits of Al-Alloyed High--Low Junctions . . . ," Solid-State Electronics, vol. 24 (1981), pp. 415-420.

Primary Examiner—Aaron Weisstuch
Attorney, Agent, or Firm—Spencer & Frank

[57] ABSTRACT

In a process for the production of a solar cell with a p-n junction and a conductive antireflection coating, there is deposited on a semiconductor body a first layer as a diffusion source for the production of the p-n junction and also for the doping of the antireflecting coating, and on the first layer a second layer for the production of the antireflection coating.

17 Claims, 12 Drawing Figures

PROCESS FOR THE PRODUCTION OF A SOLAR CELL

Background of the Invention

The invention relates to a process for the production of a solar cell with a p-n junction and an antireflection coating wherein the p-n junction is produced by diffusion of impurities from a doping layer.

Today, solar cells with an antireflection coating are, for example, produced by a doping layer being deposited on a semiconductor body, the p-n junction being produced by diffusion of impurities from this doping layer, the remaining doping layer being removed, and the solar cell contacts being deposited. In another process, there is deposited on the surface of a semiconductor body by means of centrifugal application or spraying a low-viscosity solution which acts as diffusion source for the production of the p-n junction of the solar cell and simultaneously forms an antireflection coating. Such solutions mainly consist of alcohol as a solvent. Apart from the alcohol, the solutions contain the doping material, an organic compound of the metal for the antireflection coating (metallic oxide), water, and also an acid.

The known process with the depositing of a low-viscosity solution is normally very limited. With the known process there are also limitations with respect to the choice of the doping material and antireflection coating combinations and their concentrations. It is also difficult to control the thickness of the solution deposited. A further disadvantage of the known process is that the known deposition processes such as centrifugal application, spraying, or possibly immersion, are only usable on semiconductor wafers with very smooth surfaces, since on unsmooth surfaces the solvents either accumulate (antireflection coating becomes too thick) or run off if elevations are present (antireflection coating becomes too thin). The smooth wafer surfaces required for using the known process necessitate an elaborate and expensive surface treatment, however, which is performed, for example, by chemical polishing.

Summary of the Invention

The object underlying the invention is to indicate a process for the production of a solar cell which is cost-efficient, does not necessitate smooth wafer surfaces in the production of an antireflection coating, and provides a conductive antireflection coating.

According to the invention, there is deposited, in a process for producing a solar cell, on a semiconductor body a first layer which serves as a diffusion source for producting the p-n junction and also for doping the antireflection coating, wherein there is deposited on the first layer a second layer for producing the antireflection coating, and wherein there is, furthermore, performed an annealing process in which the p-n junction is produced and the antireflection coating is doped and thereby becomes conductive.

The invention has the substantial advantage that conductive antireflection coatings may be produced on relatively rough semiconductor surfaces, which eliminates the necessity of expensive polishing of the semiconductor surface. Another advantage of the invention is that the doping materials which serve to produce the p-n junction of the solar cell and also render the antireflection coating conductive, are prevented from out-diffusion by thereby transverse diffusion. It is also possible to employ a variety of processes for deposition of the doping layer and the layer which mainly forms the antireflection coating. Also, the doping material or its compound in the doping layer, the antireflection coating constituent, and the carrier materials may be chosen freely without the occurrence of chemical reactions resulting in precipitations or other undesired reactions. Accordingly, a plurality of the previously existing technologies, apart from drying or baking measures which may prove necessary, may still be used or combined. Since the antireflection coating is rendered conductive in the process according to the invention, the invention enables the application of contacts on the antireflection coating. The process according to the invention thereby prevents short-circuiting of the p-n junction when contact is established. According to a further development of the invention, a semiconductor zone of the same conductivity type as the semiconductor body whose conductivity is greater than that of the semiconductor body is produced on the rear side of the solar cell in the surface area of the semiconductor body. On this semiconductor zone, a conductive antireflection coating is produced so that a conductive antireflection coating is also present on the rear side of the solar cell. The production of the semiconductor zone of the same conductivity type as the semiconductor body and also the antireflection coating is carried out, for example, in an analogous manner to the production of the p-n junction and the antireflection coating on the front side by depositing on the rear side of the semiconductor body a third layer which serves substantially as a diffusion source for the production of the semiconductor zone of the same conductivity type as the semiconductor body and also for the doping of the antireflection coating. On this third layer there is deposited a fourth layer which together with the third layer constitutes the antireflection coating. There then follows an annealing process wherein a p-n junction forms on the front side, and a $p^+p$ "high-low" junction forms on the rear side, and, in addition, conductive antireflection coatings are formed from the two layers on the front side and on the rear side. Or a separate annealing measure is carried out wherein the high-low junction forms on the rear side and, in addition, the conductive antireflection coating is formed on the rear side from the two layers.

The first and third layers consist, for example, of doped $SiO_2$, $Ta_2O_5$, $TiO_x$, or combinations thereof. For the second and fourth layers the use of $SiO_2$, $Ta_2O_5$, $TiO_x$, or combinations thereof is also recommended. The first and third layers are deposited, for example, by centrifugal application, immersion, spraying, screen printing, or rolling on. The second and fourth layers are produced, for example, by evaporation deposition, chemical precipitation from the gaseous phase, or by screen printing.

The concentration of doping material in the first and third layers is chosen as high as possible. These layers should, furthermore, be as thin as possible. The second and fourth layers are preferably made so thick that the optical overall thickness of the first and second layers and also of the third and fourth layers constitutes one quarter of the wavelength of the reflection minimum.

Brief Description of the Drawings

The invention will now be described in greater detail, by way of examples, with reference to the drawings in which.

Description of the Preferred Embodiments

Figure 1:
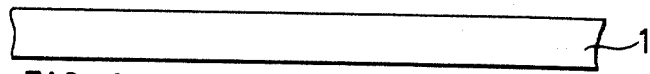
FIG. 1 shows the initial body for the production of a solar cell.
Figure 2:
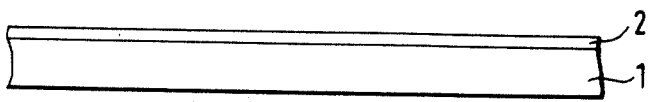
FIG. 2 shows the deposition of a doping film.

To produce a solar cell according to the invention, one starts, in accordance with FIG. 1, for example, with a semiconductor body 1 made of silicon and of the p-conductivity type, which may, for example, have a specific resistance of 0.1 to 10 Ohm-cm. A layer 2 which is deposited as a doping film on the semiconductor body 1, as shown in FIG. 2, serves as a diffusion source for the production of the p-n junction of the solar cell. Since impurities are required for the production of the p-n junction, which produce in the semiconductor body a semiconductor zone whose conductivity type is the opposite of that of the semiconductor body, the doping layer 2 contains impurities such as phosphorous or arsenic which produce the n-conductivity type when a semiconductor body of the p-conductivity type is used.

The doping layer 2 consists, for example, of $SiO_2$ or $TiO_x$, with interspersed impurities (e.g. phosphorous or arsenic). The doping layer 2 is to be made in such a way that the doping material concentration in it is as high as possible (more than $2 \times 10^{21}$ per $cm^3$), while on the other hand, the concentration of the remaining constituents serving as carrier material (e.g. titanium and silicon compounds) ought to be as low as possible.

The doping film 2 is applied as thin as possible, or the solvent fraction is chosen so high that for the diffusion process for the production of the p-n junction there is a sufficient quantity of doping material available, but, on the other hand, the glass matrix ($SiO_2$, $TiO_x$) resulting from the diffusion annealing process is as thin as possible. The doping layer 2 is made so thin in order to ensure that relatively large variations in the thickness of layer 2, which are unavoidable with comparatively uneven semiconductor surfaces, have as little effect as possible on the optical overall thickness of the antireflection coating which is formed from a layer still to be deposited on the layer 2. Correspondingly thin dimension of the doping layer 2 ensures an antireflection coating of relatively uniform thickness even with a relatively uneven semiconductor surface. The deposition of the doping layer 2 is carried out, for example, by means of centrifugal application, spraying, immersion, screen printing, or rolling on of a doping film.

Prior to the deposition of layer 3, a pre-drying or baking of layer 2 at temperatures of 200° to 600° C. may be carried out.

Figure 3:
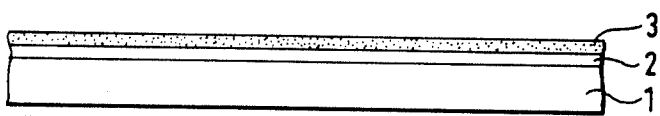
FIG. 3 shows the deposition of a further layer.

The deposition of layer 3 on the layer 2, which together form the antireflection coating, is shown in FIG. 3. The layer 3 is produced, for example, by evaporation deposition, chemical precipitation from the gaseous phase in accordance with the so-called CVD process, or by means of screen printing. The layer 3 is of such thick dimension that the antireflection coating 6 produced from layers 2 and 3 has an optical overall thickness of one quarter of the wavelength of the desired reflection minimum.

Figure 4:
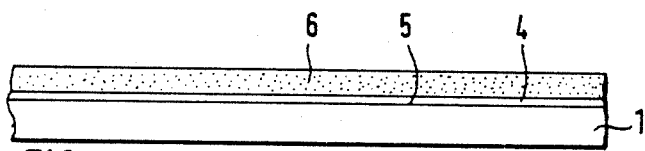
FIG. 4 shows the production of the p-n junction.

Following the production of layer 3 there is performed an annealing process wherein the impurities from the doping layer 2 diffuse into the semiconductor body 1 where, as shown in FIG. 4, they produce a semiconductor zone 4 whose conductivity type is the opposite of that of the semiconductor body 1 and which therefore forms a p-n junction 5 within the semiconductor body 1. In the annealing process which may, for example, be carried out at a temperature of 850° to 1000° C., lasting one hour, the two layers 2 and 3 fuse together to form a common conductive antireflection layer 6 (FIG. 4). The layer 3 prevents significant concentrations of the doping material from diffusing out. The doping materials not only diffuse into the semiconductor body 1 during the annealing process, however, but also diffuse into the antireflecting coating 6, ensuring that the overall antireflecting coating 6 formed from the layers 2 and 3 becomes conductive.

Figure 5:
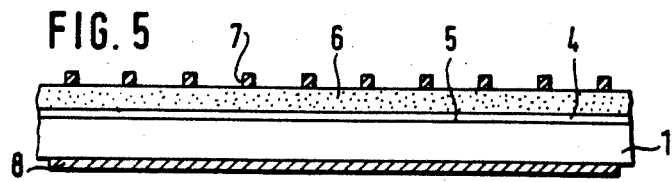
FIGS. 5 to 7 show various front side contacts.
Figure 6:
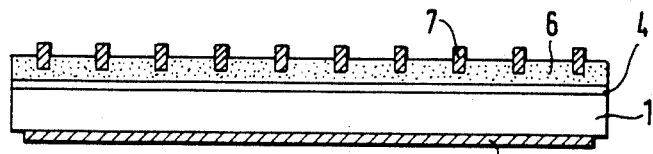

Since the antireflection coating 6 is conductive following the annealing treatment, it is sufficient to apply the front side contact 7 according to FIG. 5 to the surface of the antireflection coating 6 only. The front side contact 7 may, however, according to FIG. 6, also be partly, or, according to FIG. 7, entirely alloyed into the antireflection coating 6. The rear side contact 8 which in the embodiment (FIG. 5 to 7) is of total surface design is applied to the rear side of the semiconductor body 1.

Figure 7:
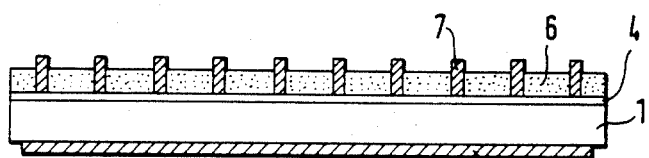
Figure 8:
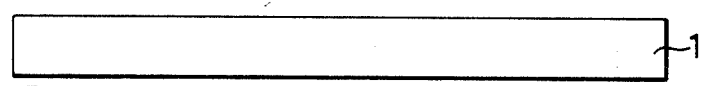
FIG. 8 shows the initial body for a second embodiment.
Figure 9:
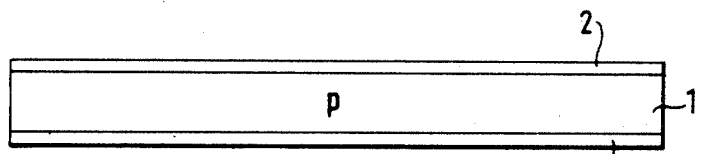
FIG. 9 shows doping films on front and rear side.
Figure 10:
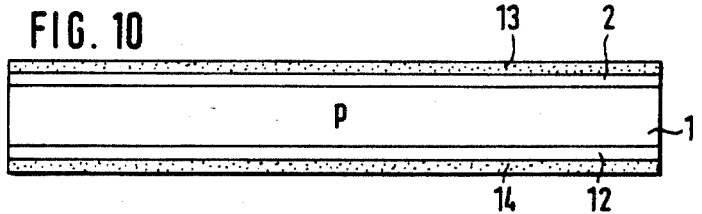
FIG. 10 shows the deposition of further layers.
Figure 11:
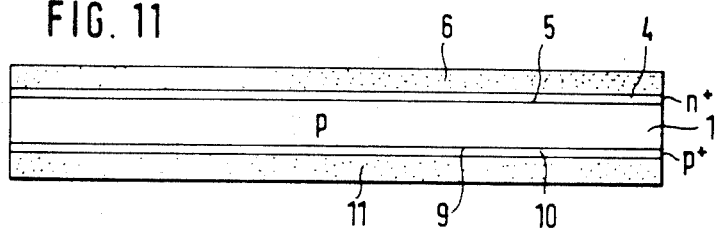
FIG. 11 shows the production of junctions.
Figure 12:
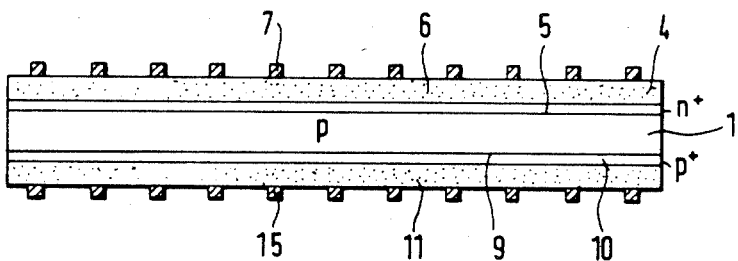
FIG. 12 shows the finished solar cell.

FIGS. 8 to 12 show an embodiment of the invention in which a solar cell is produced which differs from the solar cell of FIG. 7 in that there are two junctions, more particularly, on the front side the p-n junction 5 of the solar cell, and on the rear side of the solar cell a high-low junction 9 which is formed by semiconductor zones of the same conductivity type, but of different conductivity. In the embodiment, the junction 9 is a $p^+p$ junction whose $p^+$ zone 10, like the semiconductor zone 4, is covered by an antireflection coating 11.

The production of the $p^+p$ high-low junction 9 and of the antireflection coating 11 located on the $p^+$ zone 10 is carried out in a completely analogous manner to the production of the p-n junction 5 and the antireflection coating 6 on the front side of the solar cell. To produce the solar cell in FIG. 12, one starts, according to FIG. 8, again from a semiconductor body 1 of the p-conductivity type, deposits again a doping film 2 (with interspersed n-impurities) on the front side, according to FIG. 9, and—contrary to the first embodiment of FIGS. 1 to 7—provides also the rear side with a doping film 12 which, however, in contrast to the doping film 2, comprises p-impurities. Following this, there is deposited, according to FIG. 10, on both doping films 2, 12 respective layers 13, 14 required to produce the antireflection coating, which is subsequently annealed at a temperature of 900°-950° C. for such a length of time (aproximately one hour) until in the semiconductor body according to FIG. 11 the semiconductor zones 4 and 10 and thus the junctions 5 and 9 are produced, and the doping films 2, 12 with the respective layers 13, 14 which cover them fuse together to form respective antireflection layers 6, 11 according to FIG. 11. During the annealing process, the antireflection coatings 6 and 11 are made conductive, so that the front side contact 7 and the rear side contact 15 according to FIG. 12 can be applied directly onto the respective antireflection coatings 6, 11. The rear side contact 15 is, contrary to the rear side contact 8 of the first embodiment, designed in the same manner as the front side contact 7, i.e., generally finger-shaped.

The $p^+p$ high-low junction acts as a Back Surface Field which provides the known advantages of a BSF cell such as increased open circuit voltage and increased short circuit currernt owing to decreased recombination on the rear side. The shown embodiment of the rear side contact also permits photovoltaic conversion of light shining onto the rear side, while the unwanted heat radiation can simultaneously flow through the cell almost unobstructed, without being absorbed, whereby the operating temperature is decreased.

Contrary to the embodiment of FIGS. 8 to 12, the $p^+p$ junction and the conductive antireflection coating on the rear side may also be formed separately. In this case, the junction on the side on which the annealing step for formation of the junction and the conductive antireflection coating is performed at a higher temperature or for a longer time than on the other side is preferably formed first.

What is claimed is:

1. A process for producing a solar cell with a p-n junction and a conductive antireflection coating, wherein there is deposited on the front surface of a semiconductor body a first layer serving as a diffusion source for the production of the p-n junction and also for the doping of the antireflection coating, wherein a second layer for the production of the antireflection coating is deposited on the first layer, and wherein an annealing process is performed in which the p-n junction is produced, the antireflection coating is formed from the two layers, and the antireflection coating is doped and thereby made highly conductive.

2. A process according to claim 1, wherein there is produced on the rear surface of the semiconductor body a semiconductor zone of the same conductivity type as the semiconductor body, with its conductivity being greater than that of the semiconductor body, and a highly conductive antireflection coating is produced on this semiconductor zone.

3. A process according to claim 2, wherein there is deposited on the rear surface of the semiconductor body a third layer serving as a diffusion source for the production of the greater conductivity zone of the same conductivity type as the semiconductor body and also for doping of the antireflection coating, wherein there is deposited on the third layer a fourth layer for producing the antireflection coating of the rear surface, and wherein in the annealing process for the production of the p-n junction and the antireflection coating of the front surface or in a separate annealing process the semiconductor zone of the same conductivity type as that of the semiconductor body is formed on the rear surface of the solar cell, and the conductive antireflection coating of the rear surface is formed from the third and fourth layers.

4. A process according to claim 3, wherein the first and third layers consist of doped $SiO_2$, $TiO_x$, $Ta_2O_5$, or combinations thereof.

5. A process according to claim 3, wherein the first and third layers are deposited by centrifugal application, spraying, immersion, precipitation, screen printing, or rolling on.

6. A process according to claim 3, wherein the concentration of doping material in the first and third layers is as high as possible.

7. A process according to claim 3, wherein the first and third layers are made as thin as possible.

8. A process according to claim 3, wherein the second and fourth layers consist of $SiO_2$, $TiO_x$, $Ta_2O_5$, or combinations thereof.

9. A process according to claim 3, wherein the second and fourth layers are formed by evaporation deposition, chemical precipitation from the gaseous phase, or by screen printing.

10. A process according to claim 3, wherein the second and fourth layers are made so thick that the optical overall thickness of the first and second layers and also the third and fourth layers is one quarter of the wavelength of the reflection minimum.

11. A process according to claim 1, wherein the first layer consists of doped $SiO_2$, $TiO_x$, $Ta_2O_5$ or combinations thereof.

12. A process according to claim 1, wherein the first layer is deposited by centrifugal application, spraying, immersion, precipitation, screen printing, or rolling on.

13. A process according to claim 1, wherein the concentration of doping material in the first layer is as high as possible.

14. A process according to claim 1, wherein the first layer is made as thin as possible.

15. A process according to claim 1, wherein the second layer consists of $SiO_2$, $TiO_x$, $Ta_2O_5$, or combinations thereof.

16. A process according to claim 1, wherein the second layer is formed by evaporation deposition, chemical precipitation from the gaseous phase, or by screen printing.

17. A process according to claim 1, wherein the second layer is made so thick that the optical overall thickness of the first and second layers is one quarter of the wavelength of the reflection minimum.

* * * * *